US011094638B2

(12) United States Patent
Yamada

(10) Patent No.: US 11,094,638 B2
(45) Date of Patent: Aug. 17, 2021

(54) SEMICONDUCTOR DEVICE

(71) Applicant: FUJI ELECTRIC CO., LTD., Kawasaki (JP)

(72) Inventor: Takafumi Yamada, Matsumoto (JP)

(73) Assignee: FUJI ELECTRIC CO., LTD., Kawasaki (JP)

(\*) Notice: Subject to any disclaimer, the term of this patent is extended or adjusted under 35 U.S.C. 154(b) by 0 days.

(21) Appl. No.: 16/889,209

(22) Filed: Jun. 1, 2020

(65) Prior Publication Data

US 2020/0294925 A1 Sep. 17, 2020

Related U.S. Application Data

(63) Continuation of application No. PCT/JP2019/018426, filed on May 8, 2019.

(30) Foreign Application Priority Data

Jun. 18, 2018 (JP) .............................. JP2018-115327

(51) Int. Cl.
*H01L 23/538* (2006.01)
*H01L 23/00* (2006.01)
(Continued)

(52) U.S. Cl.
CPC .......... *H01L 23/5386* (2013.01); *H01L 23/10* (2013.01); *H01L 23/492* (2013.01); *H01L 23/5385* (2013.01); *H01L 24/06* (2013.01)

(58) Field of Classification Search
CPC ... H01L 23/5386; H01L 23/10; H01L 23/492; H01L 23/5385; H01L 24/06
See application file for complete search history.

(56) References Cited

U.S. PATENT DOCUMENTS

2011/0042741 A1 2/2011 Fukuoka et al.
2012/0104580 A1\* 5/2012 Feng .................. H01L 29/0657
257/673

FOREIGN PATENT DOCUMENTS

JP 2000349207 A 12/2000
JP 2001274206 A 10/2001
(Continued)

OTHER PUBLICATIONS

Translation by WIPO dated Dec. 30, 2020 of International Preliminary Report on Patentability for International Application No. PCT/JP2019/018426, 6 pages.
(Continued)

*Primary Examiner* — Peniel M Gumedzoe

(57) ABSTRACT

A semiconductor device includes a semiconductor chip including a semiconductor substrate with a top surface electrode deposited on a top surface of the semiconductor substrate. An insulating film selectively covers edges of a top surface of the top surface electrode, and a plating layer covers the top surface of the top surface electrode exposed to an opening of the insulating film. A metal wiring plate includes a junction part located over the insulating film and the plating layer, and provided with a groove recessed upward from a bottom surface of the junction part. A solder part fills the groove so as to bond the plating layer and the bottom surface of the junction part together. A boundary between the insulating film and the plating layer is encompassed within the groove.

5 Claims, 11 Drawing Sheets

(51) Int. Cl.
*H01L 23/10* (2006.01)
*H01L 23/492* (2006.01)

(56) References Cited

FOREIGN PATENT DOCUMENTS

| | | |
|---|---|---|
| JP | 2006190728 A | 7/2006 |
| JP | 2006216736 A | 8/2006 |
| JP | 201166377 A | 3/2011 |
| JP | 2012191012 A | 10/2012 |
| JP | 2013179229 A | 9/2013 |

OTHER PUBLICATIONS

International Search Report dated Jul. 2, 2019 of International Application No. PCT/JP2019/018426.

* cited by examiner

SEMICONDUCTOR DEVICE

CROSS-REFERENCE TO RELATED APPLICATION

This application is a Continuation of PCT Application No. PCT/JP2019/018426, filed on May 8, 2019, and claims the priority of Japanese Patent Application No. 2018-115327, filed on Jun. 18, 2018, the content of both of which is incorporated herein by reference.

BACKGROUND OF THE INVENTION

1. Field of the Invention

The present invention relates to a semiconductor device to be used as a power semiconductor module.

2. Description of the Related Art

Power semiconductor modules are known that include semiconductor chips including main electrodes and insulating films dividing the main electrodes, and include metal wiring plates bonded to the semiconductor chips by soldering.

For example, Japanese Unexamined Patent Application Publication No. 2006-216736 A discloses a semiconductor device in which an electrode part of a semiconductor chip and a frame which is a metal piece are connected by soldering. Japanese Unexamined Patent Application Publication No. 2006-190728 A discloses a power semiconductor device in which parts corresponding to troughs of a lead formed into a waveform are connected to an electrode on a surface of a semiconductor substrate, and parts corresponding to crests of the lead are located close to a surface of a casing.

Japanese Unexamined Patent Application Publication No. 2000-349207 A discloses a semiconductor device in which a semiconductor chip is sandwiched between a bonded member bonded to an electrode of the semiconductor chip via bumps and a radiating plate. Japanese Unexamined Patent Application Publication No. 2012-191012 A discloses a semiconductor device in which a member connected to an emitter electrode has slits at positions opposed to a passivation film.

Japanese Unexamined Patent Application Publication No. 2011-66377 A discloses a semiconductor device including an insulating layer interposed between a wire of a gate electrode and a solder, in addition to a passivation film for the wire of the gate electrode, so as to avoid a fault by a short circuit between a gate and an emitter.

The respective semiconductor devices disclosed in these documents may cause cracks in the main electrode derived from the metal wiring plate or the solder when subjected to a temperature cycle test.

SUMMARY OF THE INVENTION

In view of the foregoing issue, the present invention provides a semiconductor device capable of avoiding cracks in a main electrode so as to improve structural reliability.

To solve the conventional problem described above, a semiconductor device according to an aspect includes (a) a semiconductor chip including a semiconductor substrate having a top surface, a top surface electrode deposited on the top surface of the semiconductor substrate, an insulating film selectively covering edges of a top surface of the top surface electrode, and a plating layer covering the top surface of the top surface electrode exposed to an opening of the insulating film, (b) a metal wiring plate including a junction part located over the insulating film and the plating layer, and provided with a groove recessed upward from a bottom surface of the junction part, and (c) a solder part filling the groove so as to bond the plating layer and the bottom surface of the junction part together. A boundary between the insulating film and the plating layer of the semiconductor device according to the aspect is encompassed within the groove in a plan view, and the solder part has a thickness greater on the boundary than on the plating layer.

DETAILED DESCRIPTION

Figure 1:
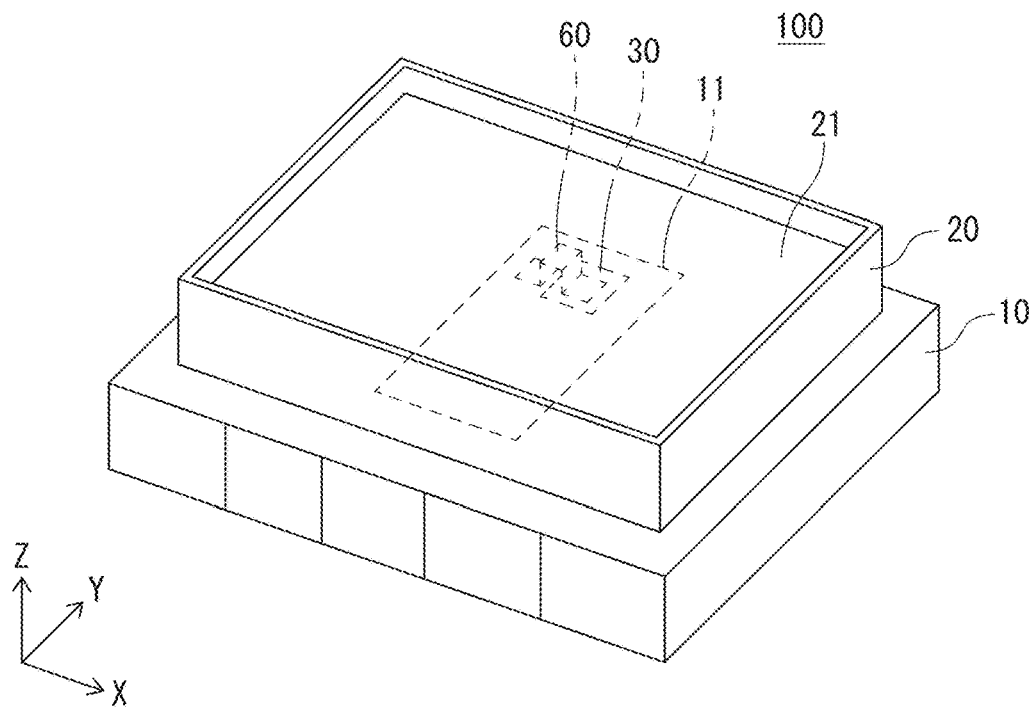
FIG. 1 is a perspective view illustrating an external appearance of a semiconductor device according to an embodiment of the present invention.

Hereinafter, an embodiment of the present invention will be described with reference to the drawings. In the description of the Drawings below, the same or similar components are denoted by the same or similar reference numerals, and overlapping explanations are not made below. It should be understood that the Drawings are illustrated schematically, and relationships between thicknesses and planar dimensions, and proportions of the thicknesses of the respective layers are not drawn to scale. It also should be understood that the relationships or proportions of the dimensions between the respective Drawings may differ from each other. The embodiment described below illustrates a device and a method for embodying the technical ideas of the present invention, and the technical ideas of the present invention are not intended to be limited to the materials, shapes, structures, or arrangements of the elements as described herein.

In the following description, the directional definitions such as "top" and "bottom" are made for illustration purposes, and are not intended to limit the technical ideas of the present invention. For example, when the direction of a target is changed by 90 degrees and is then observed, the terms "top" and "bottom" change to the terms "left" and "right". When the observing direction of the target is changed by 180 degrees, the terms "top" and "bottom" shall be reversed.

(Semiconductor Device)

As illustrated in FIG. 1, a semiconductor device 100 according to the embodiment of the present invention includes a semiconductor chip 30 and a metal wiring plate 60. The semiconductor device 100 may include a radiator 10, a stacked substrate 11, a case 20, and a sealing resin 21. The semiconductor chip 30 is an element having a function of controlling a flow of a main current by an active region including a p-n junction formed in a semiconductor substrate 29 (refer to FIG. 7). The top surface of the radiator 10 is in direct or indirect contact with the bottom surface of the stacked substrate 11. The inner portion of the case 20 is filled with the sealing resin 21 for sealing the top surface of the stacked substrate 11, the semiconductor chip 30, the metal wiring plate 60, and the like. The semiconductor device 100 according to the embodiment is a power semiconductor device (a power device) using the semiconductor chip 30 serving as a power semiconductor, for example, so as to convert input electric power to predetermined electric power. The embodiment is illustrated below with the semiconductor device 100 including the single stacked substrate 11, the single semiconductor chip 30, and the single metal wiring plate 60 for illustration purposes. The semiconductor device 100 may include a plurality of stacked substrates, a plurality of semiconductor chips, and a plurality of metal wiring plates. The illustration in the drawings or the explanations are not made below with regard to terminals, wires, and signal processing circuits, for example, used for the connection to external components.

The radiator 10 radiates heat, which is generated by the semiconductor chip 30 and the like when the main current flows to the active region, to the outside via the stacked substrate 11. The radiator 10 is a heat sink having a substantially cuboidal shape formed of a material having high heat conductivity such as aluminum (Al). The radiator 10 may include a plurality of fins so as to increase the surface area to improve the radiation performance. The spaces between the respective fins can serve as flow channels of a coolant. The coolant may be either a liquid such as an ethylene glycol aqueous solution or water or a gas such as air. A coolant capable of a phase transition, such as chlorofluorocarbon, may also be used.

The case 20 has a rectangular frame-like shape, for example, and is arranged to surround the components such as the stacked substrate 11, the semiconductor chip 30, and the metal wiring plate 60 on the top surface of the radiator 10 via the sealing resin 21. The case 20 may be formed of either a conductive material such as metal or an insulating material such as resin. The sealing resin 21 used may be a resin having high insulating properties and moldability, such as epoxy resin or maleimide resin. A coefficient of linear expansion and a Young's modulus of the sealing resin 21 can be regulated depending on the amount of filler mixed with the resin.

Figure 2:
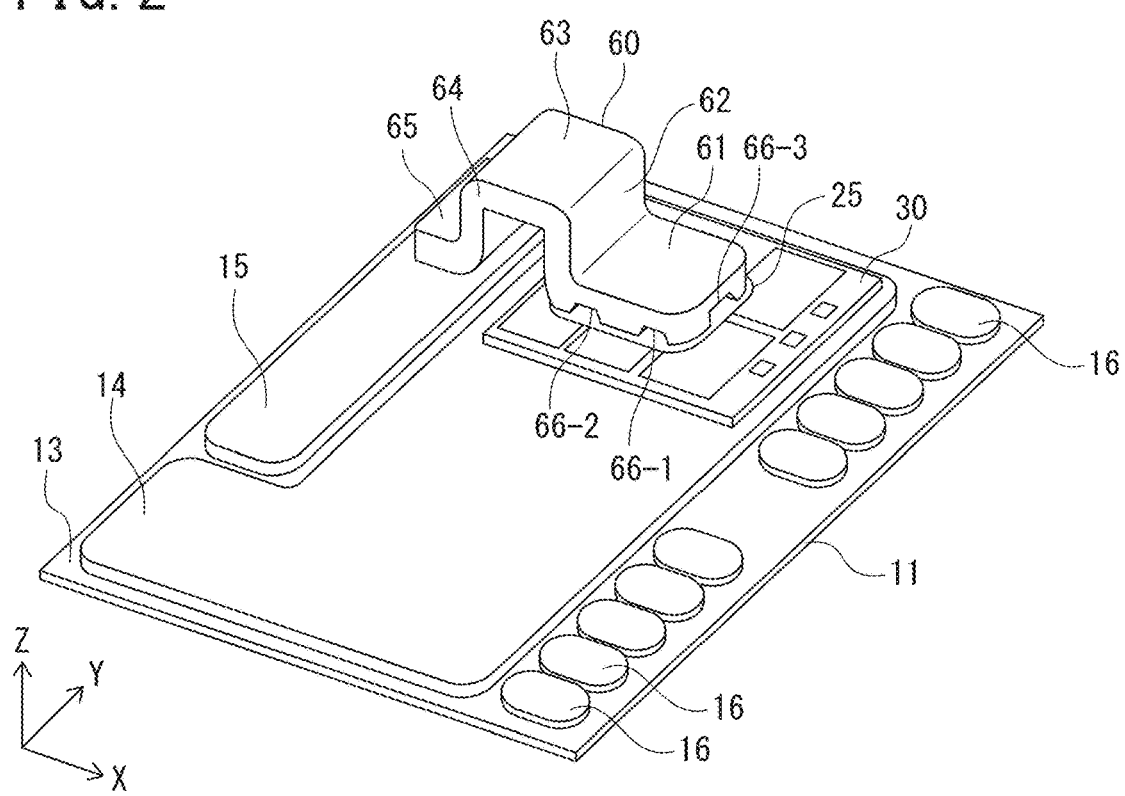
FIG. 2 is a perspective view illustrating an internal structure of the semiconductor device according to the embodiment of the present invention while omitting a radiator, a case, and a sealing resin.
Figure 3:
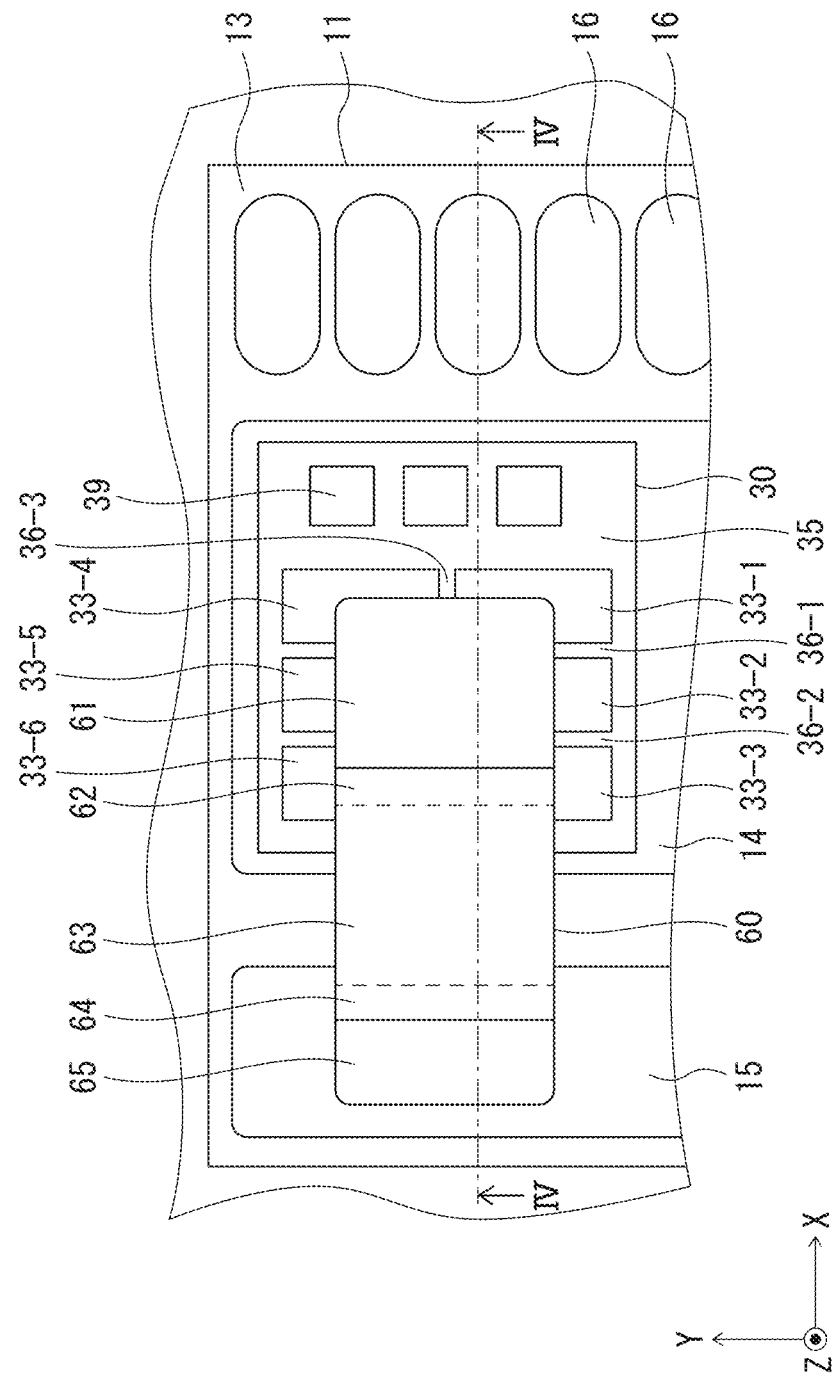
FIG. 3 is a plan view illustrating a stacked substrate, a semiconductor chip, and a metal wiring plate of the semiconductor device according to the embodiment of the present invention.
Figure 4:
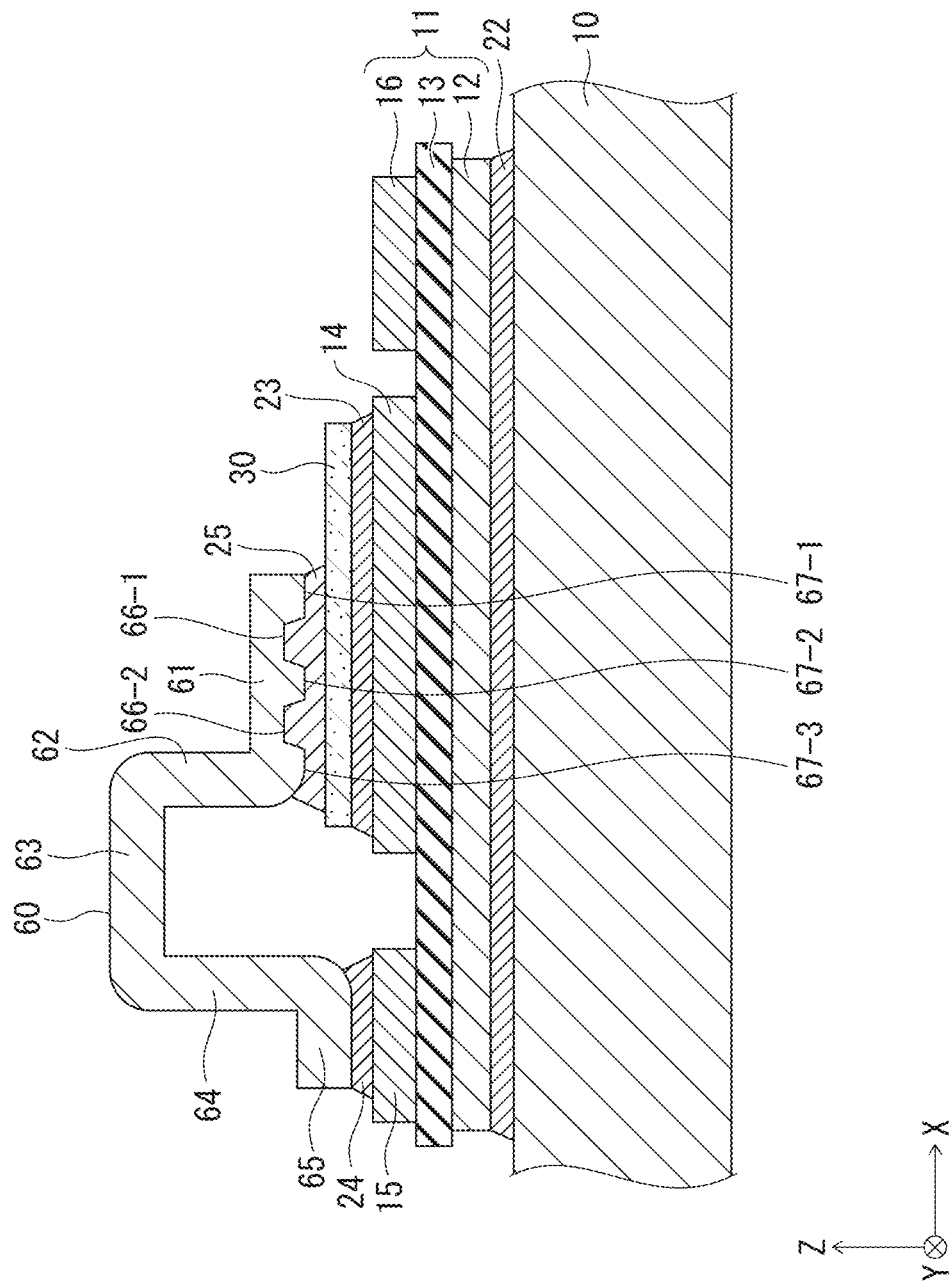
FIG. 4 is a cross-sectional view as viewed from direction IV-IV in FIG. 3.

As illustrated in FIG. 2 to FIG. 4, the stacked substrate 11 includes an insulating substrate 13, a metal plate 12 bonded to the bottom surface of the insulating substrate 13, and circuit pattern layers (14, 15, 16) bonded to the top surface of the insulating substrate 13. The stacked substrate 11 may be a DCB substrate in which copper is directly bonded to a surface of a ceramic substrate, or an AMB substrate in which metal is provided on a surface of a ceramic substrate by active metal brazing, for example. The stacked substrate 11 is bonded and thermally connected to the top surface of the radiator 10 by a solder part 22. The solder part 22 may be a tin (Sn)-antimony (Sb)-based or Sn—Sb-silver (Ag)-based hard solder. The stacked substrate 11 may be arranged such that its main surface is parallel to the X-Y plane.

As illustrated in FIG. 2 to FIG. 4, the circuit pattern layers (14, 15, 16) include a first circuit pattern layer 14, a second circuit pattern layer 15, and a plurality of third circuit pattern layers 16. The first circuit pattern layer 14 is provided with the semiconductor chip 30 mounted on its top surface, and the second circuit pattern layer 15 is provided with the metal wiring plate 60 bonded to its top surface. The circuit pattern layers (14, 15, 16) are electrically connected to the semiconductor element implementing the semiconductor chip 30, and communicate with the semiconductor element implementing the semiconductor chip 30 to transfer and receive electricity and electric signals. The circuit pattern layers (14, 15, 16) may include metal wires, pads, and the like provided on the top surface of the insulating substrate 13, and may include signal processing circuits and the like.

Figure 7:
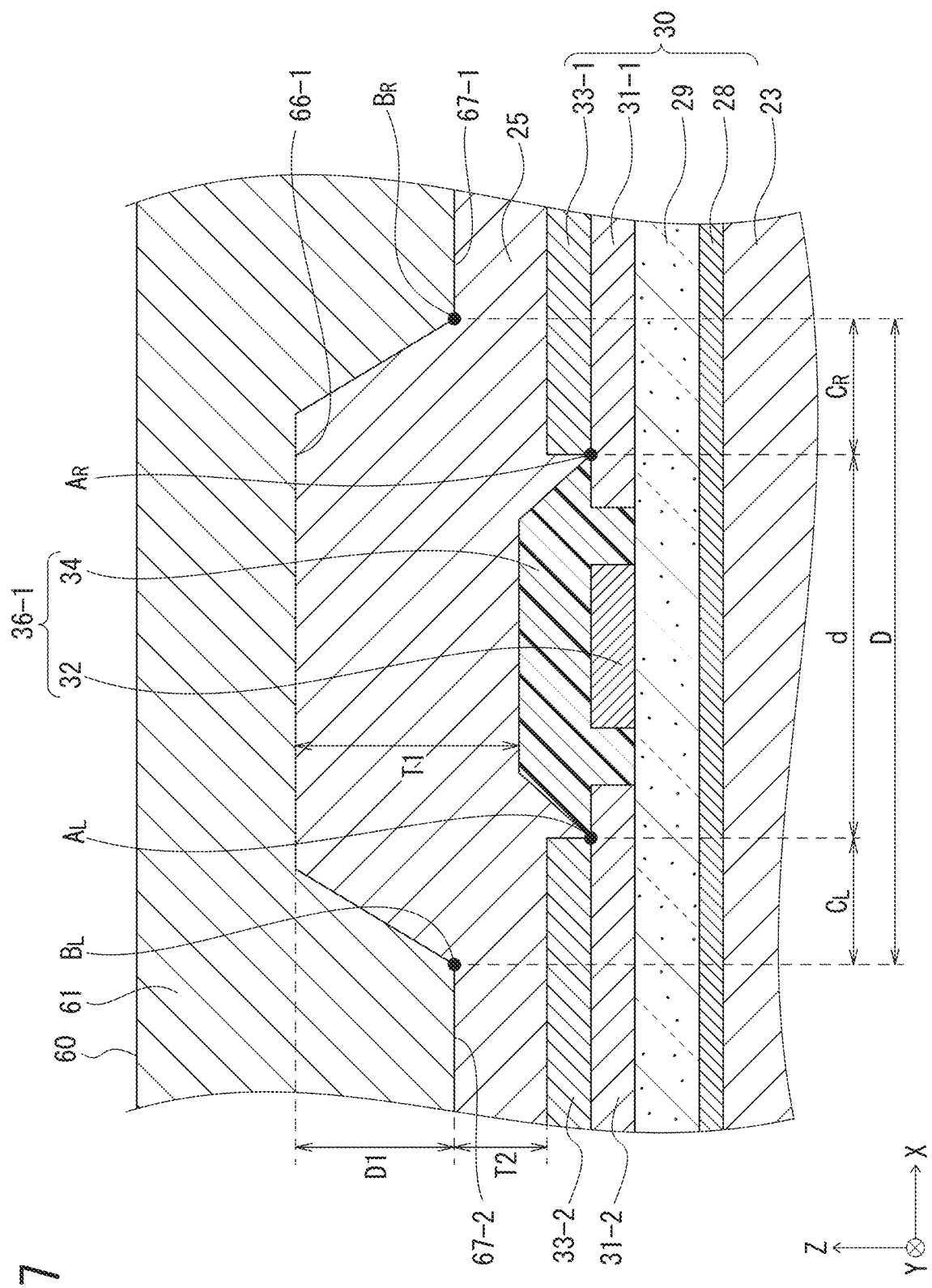
FIG. 7 is a cross-sectional view as viewed from direction VII-VII in FIG. 6.

As illustrated in FIG. 7, the semiconductor chip 30 includes the semiconductor substrate 29, a top surface electrode 31-1 and the like deposited on the top surface of the semiconductor substrate 29, an insulating film 34 and the like selectively covering end portions of the top surface electrode 31-1 and the like, and a plating layer 33-1 and the like covering the top surface electrode 31-1 and the like exposed to the opening of the insulating film 34 and the like. A first main electrode implemented by the top surface electrode 31-1 and the like and the plating layer 33-1 and the like is divided by the insulating film 34 and the like arranged into a grid-like pattern.

The semiconductor substrate 29 has a top surface and a bottom surface opposed to the top surface. The semiconductor substrate 29 is a semiconductor piece formed of a semiconductor material such as silicon (Si), silicon carbide (SiC), or gallium nitride (GaN), for example. The semiconductor chip 30 has a thickness of about 50 to 450 micrometers, and has a rectangular shape having a length of about 5 to 15 millimeters on each side. The semiconductor element formed in the semiconductor substrate 29 to implement the semiconductor chip 30 includes a vertical semiconductor element such as an insulated-gate bipolar transistor (IGBT) or a power MOSFET. The semiconductor element may include a bipolar junction transistor (BJT), a field-effect transistor (FET), a static induction transistor (SIT), a gate turn-off (GTO) thyristor, and a static induction (SI) thyristor, for example. The semiconductor element may further include a diode such as a Schottky-barrier diode in addition to the semiconductor switching elements listed above. The semiconductor element implementing the semiconductor chip 30 may also include a reverse-blocking IGBT (RB- IGBT) or a reverse-conducting IGBT (RC-IGBT) in which an IGBT and a freewheeling diode are integrated into a single chip.

The semiconductor chip 30 is illustrated herein with a vertical element in which a plurality of first main electrodes are provided on the top surface of the semiconductor substrate 29, and a second main electrode is provided on the bottom surface of the semiconductor substrate 29. When the semiconductor element implementing the semiconductor chip 30 is an IGBT or a BJT, the respective first main electrodes refer to one of an emitter electrode and a collector electrode, and the second main electrode refers to the other electrode. When the semiconductor element is the IGBT, the control electrode refers to a gate electrode. When the semiconductor element is the BJT, the control electrode refers to a base electrode. In a case of a FET or a SIT, the respective first main electrodes refer to one of a source electrode and a drain electrode, the second electrode refers to the other electrode, and the control electrode refers to a gate electrode. In a case of a thyristor such as a GTO thyristor, the respective first main electrodes refer to one of an anode electrode and a cathode electrode, the second electrode refers to the other electrode, and the control electrode refers to a gate electrode.

As illustrated in FIG. 4, the semiconductor chip 30 is bonded to the top surface of the first circuit pattern layer 14 via a solder part 23. The semiconductor chip 30 may be arranged such that its main surface is parallel to the X-Y plane. The second main electrode of the semiconductor chip 30 is electrically connected to the first circuit pattern layer 14, while the semiconductor chip 30 is thermally connected to the radiator 10 via the stacked substrate 11. The semiconductor chip 30 is bonded to the metal wiring plate 60 via a solder part 25. The solder part 23 has a thickness set in a range of 0.05 to 0.4 millimeters, and preferably set in a range of 0.1 to 0.2 millimeters. The solder part 25 located on the top surface of the respective plating layers 33-1 to 33-6 (refer to FIG. 3) included in the semiconductor chip 30 has a thickness set in a range of 0.05 to 0.4 millimeters, preferably set in a range of 0.05 to 0.3 millimeters, and more preferably set in a range of 0.1 to 0.2 millimeters. The solder parts 23 and 25 used may be a Sn—Sb-based or Sn-copper (Cu)-based solder, for example.

As illustrated in FIG. 3, the semiconductor chip 30 is provided with the plural plating layers 33-1 to 33-6 implementing the first main electrodes, and a plurality of electrode pads 39. A plurality of gate runners 36-1 to 36-3 are arranged between the respective patterns of the plating layers 33-1 to 33-6. The respective plating layers 33-1 to 33-6 may have a rectangular shape in a plan view. The elements "gate runners 36-1 to 36-3" serve as wires for the control electrode for controlling the main current of the semiconductor element implementing the semiconductor chip 30. A pattern of a guard ring 35 is arranged to surround the pattern of the respective plating layers 33-1 to 33-6. FIG. 4 omits the illustration of the respective plating layers 33-1 to 33-6, the guard ring 35, the respective gate runners 36-1 to 36-3, and the respective electrode pads 39 for brevity. As used herein, the phrase "in a plan view" refers to a state as viewed in the direction vertical to the top surface of the semiconductor substrate 29 (refer to FIG. 7) (in the positive direction of the Z axis).

As illustrated in FIG. 3, the two gate runners 36-1 and 36-2 extend in the direction parallel to each other (in the Y-axis direction) on the top surface of the semiconductor chip 30. The other gate runner 36-3 extends in the direction perpendicular to the gate runners 36-1 and 36-2 (in the X-axis direction). The six plating layers 33-1 to 33-6 are arranged in a 2×3 matrix form so as to be separated from each other by the three gate runners 36-1 to 36-3. The guard ring 35 is arranged along the four sides of the semiconductor chip 30 to surround the plating layers 33-1 to 33-6. The electrode pads 39 are arranged to be separated from each other inside the guard ring 35 in the planar pattern.

As illustrated in FIG. 2 to FIG. 4, the metal wiring plate 60 is a lead frame including Cu, a Cu alloy, Al, or an Al alloy, for example. The metal wiring plate 60 has a thickness of about 0.5 to 1.5 millimeters, for example. The metal wiring plate 60 includes a first junction part 61, a first upright part 62 connected to the first junction part 61, and a connection part 63 connected to the first upright part 62 so as to have a first crank shape. The bottom surface of the first junction part 61 is bonded to the top surface of the semiconductor chip 30 via the solder part 25. The metal wiring plate 60 further includes the connection part 63, a second upright part 64 connected to the connection part 63, and a second junction part 65 connected to the second upright part 64 so as to have a second crank shape. The bottom surface of the second junction part 65 is bonded to the top surface of the second circuit pattern layer 15 via a solder part 24. The first junction part 61 opposed to the respective top surfaces of the plating layers 33-1 to 33-6 includes a surface substantially parallel to the top surface of the semiconductor chip 30. The bottom surface of the second junction part 65 is opposed substantially parallel to the top surface of the second circuit pattern layer 15. The solder part 24 used may be a Sn—Cu-based or Sn—Sb-based solder, for example.

The first upright part 62 extends at an end portion of the first junction part 61 toward the connection part 63 in the upward direction, such as a right-angled direction, from the planar surface which is the top surface of the semiconductor chip 30, so as to form a substantially L-shape together with the first junction part 61. The second upright part 64 extends at an end portion of the second junction part 65 toward the connection part 63 in the upward direction, such as a right-angled direction, from the planar surface which is the top surface of the second circuit pattern layer 15, so as to form a substantially L-shape together with the second junction part 65. According to the embodiment, the first upright part 62 and the second upright part 64 extend in the vertical direction (the Z-axis direction) perpendicular to the top surface of the semiconductor chip 30 and the top surface of the second circuit pattern layer 15. The metal wiring plate 60 is processed to be bent at 90 degrees at appropriate positions with a press, for example, so as to have the first junction part 61, the first upright part 62, the connection part 63, the second upright part 64, and the second junction part 65.

The angle between the first junction part 61 and the first upright part 62 and the angle between the second upright part 64 and the second junction part 65 may be set in a range of 45 degrees or greater to 135 degrees or less, preferably set in a range of 80 degrees or greater to 100 degrees or less, and may be set to substantially 90 degrees. The main surface of the connection part 63 may be substantially parallel to the main surface of each of the first junction part 61 and the second junction part 65. The main surface of each of the first junction part 61, the connection part 63, and the second junction part 65 may be slightly inclined to the main surface of each of the semiconductor chip 30, the first circuit pattern layer 14, and the second circuit pattern layer 15.

The first main electrodes of the semiconductor chip 30 are electrically connected to the second circuit pattern layer 15 via the metal wiring plate 60. In particular, the first junction part 61 is connected to the first main electrodes of the semiconductor chip 30, and the second junction part 65 is connected to the second circuit pattern layer 15.

Figure 5:
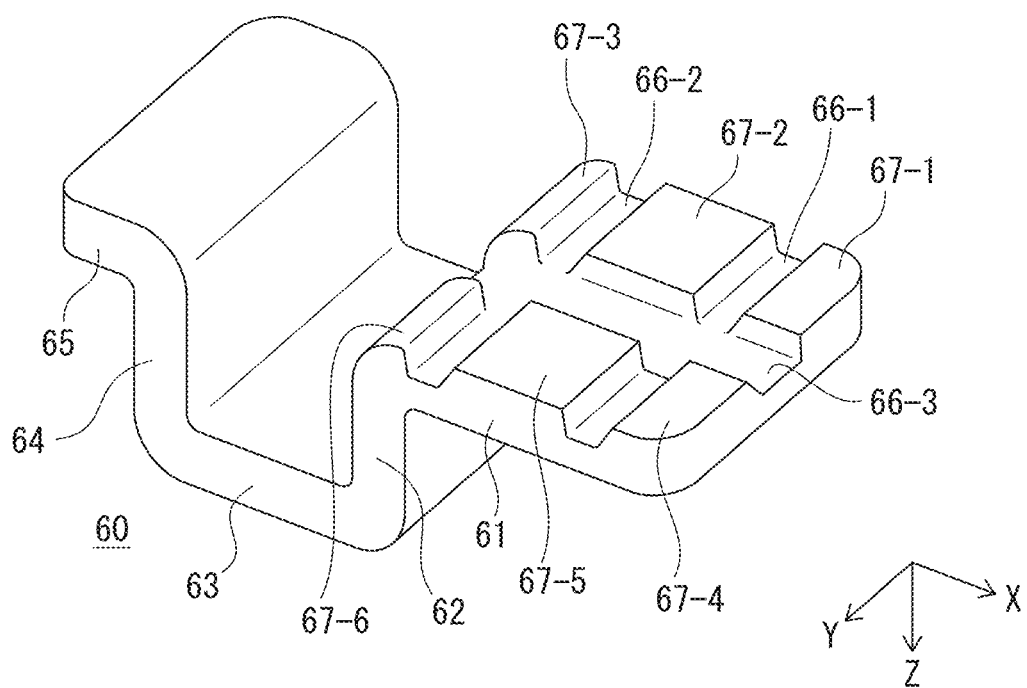
FIG. 5 is a perspective view illustrating the metal wiring plate of the semiconductor device according to the embodiment of the present invention.
Figure 6:
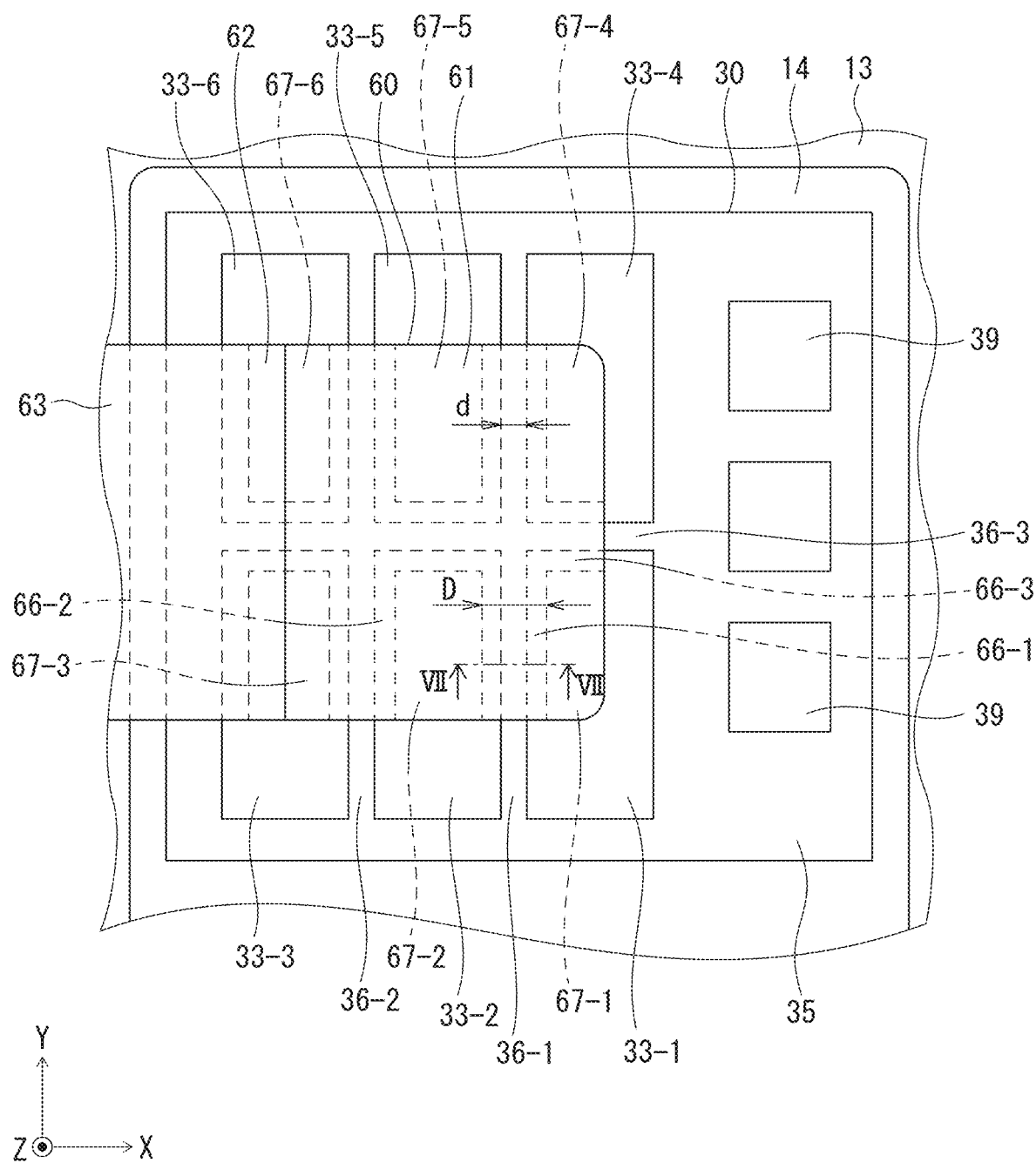
FIG. 6 is a plan view illustrating an arrangement of the semiconductor chip and the metal wiring plate of the semiconductor device according to the embodiment of the present invention.

As illustrated in FIG. 5, the first junction part 61 has three grooves 66-1 to 66-3 on the junction surface (the bottom surface) bonded to the first main electrodes of the semiconductor chip 30. The three grooves 66-1 to 66-3 are arranged to respectively correspond to the three gate runners 36-1 to 36-3 illustrated in FIG. 3. As illustrated in FIG. 6, the patterns of the grooves 66-1 to 66-3 are arranged to encompass the patterns of the gate runners 36-1 to 36-3 in the plan view. Namely, the gate runners 36-1 to 36-3 are located in the middle of the corresponding grooves 66-1 to 66-3 to be placed inside the corresponding grooves 66-1 to 66-3. As illustrated in FIG. 5, the grooves 66-1 to 66-3 are recessed from the junction surface of the first junction part 61 toward the back surface on the opposite side of the junction surface. The first junction part 61 thus has a thickness thinner at the grooves 66-1 to 66-3 than at the other regions.

As illustrated in FIG. 6, the two grooves 66-1 and 66-2 extend in the direction parallel to each other (the Y-axis direction) on the junction surface of the first junction part 61. The other groove 66-3 extends in the direction perpendicular to the grooves 66-1 and 66-2 (in the X-axis direction). The junction surface of the first junction part 61 is thus provided with flat land parts 67-1 to 67-6 separately projecting into a mesa state so as to be arranged in a 2×3 matrix form, as illustrated in FIG. 5. The six regions on the junction surface of the first junction part 61 defined by the grooves 66-1 to 66-3 correspond to the six flat land parts 67-1 to 67-6 having the flat top surfaces. The first junction part 61 thus has a thickness greater at the flat land parts 67-1 to 67-6 than at the other regions.

As illustrated in FIG. 6, the width D of the grooves 66-1 to 66-3 is greater than the width d of the gate runners 36-1 to 36-3. For example, as illustrated in FIG. 7, the side surfaces of the groove 66-1 are inclined such that the width D is decreased toward the back surface of the first junction part 61, and are connected to the surface of the top of the groove 66-1 which is parallel to the back surface of the first junction part 61. Similarly, the side surfaces of the respective grooves 66-2 and 66-3 (not illustrated) are inclined such that the width D is decreased toward the back surface of the first junction part 61, and are connected to the surface of the top of the respective grooves 66-2 and 66-3 which is parallel to the back surface of the first junction part 61. As illustrated in FIG. 6, the flat land parts 67-1 to 67-6 are located to correspond to the middle of the plating layers 33-1 to 33-6 to be encompassed within the plating layers 33-1 to 33-6 in the planar pattern.

As illustrated in FIG. 7, the semiconductor chip 30 has a region corresponding to one of the first main electrodes including the top surface electrode 31-1 on the top surface and the plating layer 33-1 deposited further on the top surface of the top surface electrode 31-1. The semiconductor chip 30 also has a region corresponding to another one of the first main electrodes including the top surface electrode 31-2 on the top surface and the plating layer 33-2 deposited further on the top surface of the top surface electrode 31-2. The top surface electrodes 31-1 and 31-2 are formed of metal or an alloy such as Al or Al—Si. The plating layers 33-1 and 33-2 are formed of metal or an alloy including nickel (Ni), for example. FIG. 7 illustrates only the two first main electrodes corresponding to the plating layer 33-1 and the plating layer 33-2. The other four plating layers 33-3 to 33-6 illustrated in FIG. 6 also have the same configuration as in the case illustrated in FIG. 7 to define the other first main electrodes including the top surface electrodes. The top surface electrodes are hereinafter collectively referred to as the "top surface electrodes 31" as necessary. The semiconductor chip 30 further includes a bottom surface electrode 28 provided on the bottom surface of the semiconductor substrate 29.

The element "gate runner 36-1" in the semiconductor device according to the embodiment is fabricated to have a structure including a wiring layer 32 deposited on the top surface of the semiconductor chip 30 and the insulating film 34 covering the wiring layer 32. The wiring layer 32 is formed of conductive material such as metal or polysilicon. The wiring layer 32 is a wire pattern electrically connecting the control electrode of the semiconductor element implementing the semiconductor chip 30 and the electrode pads 39, for example. The insulating film 34 insulates the wiring layer 32 from the plating layers 33-1 to 33-6, the top surface electrodes 31-1 and 31-2, and the solder part 25. Although not illustrated in FIG. 7, the other gate runners 36-2 and 36-3 are also fabricated to include the wiring layers arranged on the top surface of the semiconductor chip 30 and the insulating film covering the respective wiring layers. The insulating film implementing the surface of the respective gate runners 36-1 to 36-3 and the guard ring 35 may be formed of a continuous insulating film of polyimide, for example. The electrode pads 39 may be used for an electrode for temperature detection. The gate runners 36-1 to 36-3 may be arranged into a grid state in the plan view.

As illustrated in FIG. 7, the insulating film 34 selectively covers the end portions on the top surface of the respective top surface electrodes 31-1 and 31-2. The plating layers 33-1 and 33-2 cover the top surfaces of the top surface electrodes 31-1 and 31-2 exposed to the openings (windows) of the insulating film 34 so as to be in contact with the insulating film 34. Three kinds of material are thus present together along regions on the top surface of the respective top surface electrodes 31-1 and 31-2 to serve as boundaries. A pair of a right-side boundary $A_R$ and a left-side boundary $A_L$ are present on the top surface of the respective top surface electrodes 31-1 and 31-2. At the right-side boundary $A_R$, three kinds of material having different properties included in the top surface of the top surface electrode 31-1, the edge of the plating layer 33-1, and the edge of the insulating film 34 are present together in line. At the left-side boundary $A_L$, three kinds of material having different properties included in the top surface of the top surface electrode 31-2, the edge of the plating layer 33-2, and the edge of the insulating film 34 are present together in line. The right-side boundary $A_R$ and the left-side boundary $A_L$ are each indicated by a point in the cross section of FIG. 7, but are actually defined by the lines extending in the direction perpendicular to the sheet of the cross-sectional view of FIG. 7. The outlines of the right-side boundary $A_R$ and the left-side boundary $A_L$ extending in the direction perpendicular to the sheet of the cross-sectional view are indicated by the broken lines in the planar patterns of FIG. 8 to FIG. 11. The boundaries $A_R$ and $A_L$ may each have a width, may vary in line width in the extending direction, or may wind in the extending direction.

In the region around the right-side boundary $A_R$, a gap tends to be caused on the top surface electrode 31-1 between the edge of the insulating film 34 and the plating layer 33-1, and the solder part 25 may enter the gap at the right-side boundary $A_R$ to be brought into contact with the exposed part on the top surface of the top surface electrode 31-1. Similarly, in the region around the left-side boundary $A_L$, a gap tends to be caused between the edge of the insulating film 34 and the edge of the plating layer 33-2, and the solder part 25 may enter the gap at the left-side boundary $A_L$ to be brought into contact with the exposed part on the top surface of the top surface electrode 31-2. As described above, the stacked substrate 11, the semiconductor chip 30, and the metal wiring plate 60 are sealed by the sealing resin 21. When the semiconductor chip 30 is subjected to a temperature cycle test, the first upright part 62 illustrated in FIG. 2 to FIG. 6 presses or pulls the solder part 25, the plating layers 33-1 and 33-2, and the top surface electrodes 31-1 and 31-2 because of expansion or contraction due to a change in temperature. At the same time, the top surface electrodes 31-1 and 31-2 increase plastic strain amplitude at the boundaries $A_R$ and $A_L$ as compared with the other regions, which may cause cracks in the top surface electrodes 31-1 and 31-2. The plastic strain amplitude tends to be increased particularly in the gate runner 36-2 toward the first upright part 62. The cracks caused in the top surface electrodes 31-1 and 31-2 may further lead to cracks in the semiconductor chip 30.

According to the semiconductor device 100 of the embodiment, as illustrated in FIG. 7, the boundaries between the insulating film 34 and the respective plating layers 33-1 and 33-2, which correspond to the paired boundaries $A_R$ and $A_L$, are located inside the groove 66-1. As illustrated in FIG. 6, the boundaries $A_R$ and $A_L$ between the insulating film 34 (refer to FIG. 7) and the respective plating layers 33-1 and 33-2 (refer to FIG. 7) encompassed in the gate runner 36-1 substantially correspond to the positions of the edges of the gate runner 36-1, and are located inside the groove 66-1 in the plan view. As illustrated in FIG. 7, since the solder part 25 is provided to fill the groove 66-1, the thickness T1 of the solder part 25 immediately above the insulating film 34 in the region interposed between the right-side boundary $A_R$ and the left-side boundary $A_L$ is greater than the thickness T2 of the solder part 25 immediately above the respective plating layers 33-1 and 33-2. A stress exerted on the top surface electrodes 31-1 and 31-2 caused by a force received from the metal wiring plate 60 is thus released by the solder part 25 inside the groove 66-1, so as to reduce the plastic strain amplitude, improving the reliability of the semiconductor device 100 accordingly. The same effects are also applied to the other four plating layers 33-3 to 33-6 not illustrated in FIG. 7. The depth D1 of the groove 66-1 from the main surfaces of the flat land parts 67-1 and 67-2 in the Z-axis direction is set in a range of 0.2 to 0.8 millimeters, and preferably set in a range of 0.4 to 0.6 millimeters.

FIG. 8 to FIG. 11 are contour views showing simulation results of a maximum shear plastic strain amplitude (herein also referred to simply as plastic strain amplitude) in the top surface electrodes 31 in the semiconductor device according to the embodiment while changing only the width D of the respective grooves 66-1 to 66-3. The simulation was performed by use of a finite element analysis software ADINA (registered trademark; product name). FIG. 8 to FIG. 11 each show the plastic strain amplitude in a range of 0% to 1.8% by eleven-tone gradations, in which the deeper color indicates greater plastic strain amplitude. The broken lines illustrated in the drawings indicate the edges of the gate runners 36-1 to 36-3, which correspond to the positions of the respective paired boundaries $A_R$ and $A_L$. FIG. 8 to FIG. 11 omit the illustration of the top surface electrodes 31 present in the regions inside the rectangles surrounded by the broken lines on the two or three sides.

In the simulation, the top surface electrodes 31 formed of Al—Si and having a thickness of 5 micrometers, and the plating layers 33-1 to 33-6 formed of Ni and having a thickness of 4.5 micrometers were used. In addition, the solder part 25 formed of Sn-0.7 Cu and having a thickness of 100 micrometers was used so as to have a low 0.2% proof stress. The metal wiring plate 60 formed of Cu (in particular, C1020-1/2H; coefficient of linear expansion: $16.7 \times 10^{-6}/°$ C.) and having a thickness of 1.0 millimeters, and the grooves 66-1 to 66-3 having the depth D1 of 0.5 millimeters were used. The width d of the insulating film 34 was set to 260 micrometers. The plastic strain amplitude was calculated under the conditions described above as a difference of strain when the semiconductor chip 30 was heated to increase the temperature from 40° C. to 175° C. for one second, and was then cooled to 40° C. for nine seconds.

Figure 8:
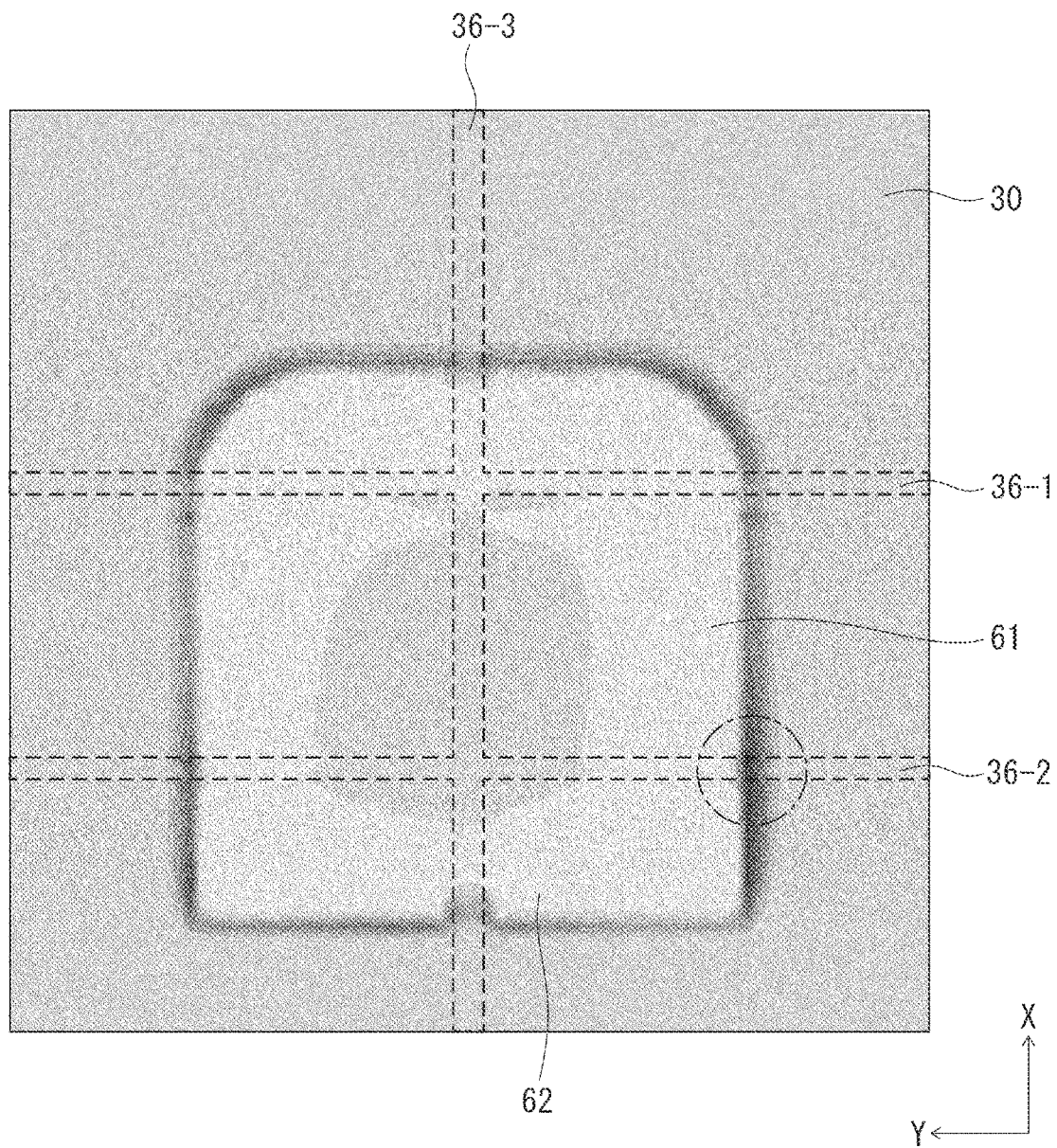
FIG. 8 is a contour view showing plastic strain amplitude of a top surface electrode bonded to the metal wiring plate with no grooves provided.

FIG. 8 shows the simulation result of the plastic strain amplitude in the top surface electrodes 31 when the width D of the grooves 66-1 to 66-3 is zero, namely, the junction surface (the bottom surface) of the first junction part 61 is not provided with the grooves 66-1 to 66-3. The simulation revealed that the plastic strain amplitude in the top surface electrodes 31 was increased along the outline of the junction surface of the first junction part 61 shown in the middle of FIG. 8 with a rectangular shape (a semicylindrical shape) rounded at the two corners on the upper side. The plastic strain amplitude was relatively increased between the first upright part 62 and a region across the gate runner 36-2 in the plan view. The plastic strain amplitude was particularly increased in the region interposing the gate runner 36-2 indicated by the dash-dotted line circle on the lower right side in the outline of the semicylindrical shape in FIG. 8, and the maximum value was about 1.55%. The plastic strain amplitude, which continuously changes between the gate runner 36-2 and the first upright part 62, had the second peak toward the first upright part 62, and the value was about 1.29%.

Figure 9:
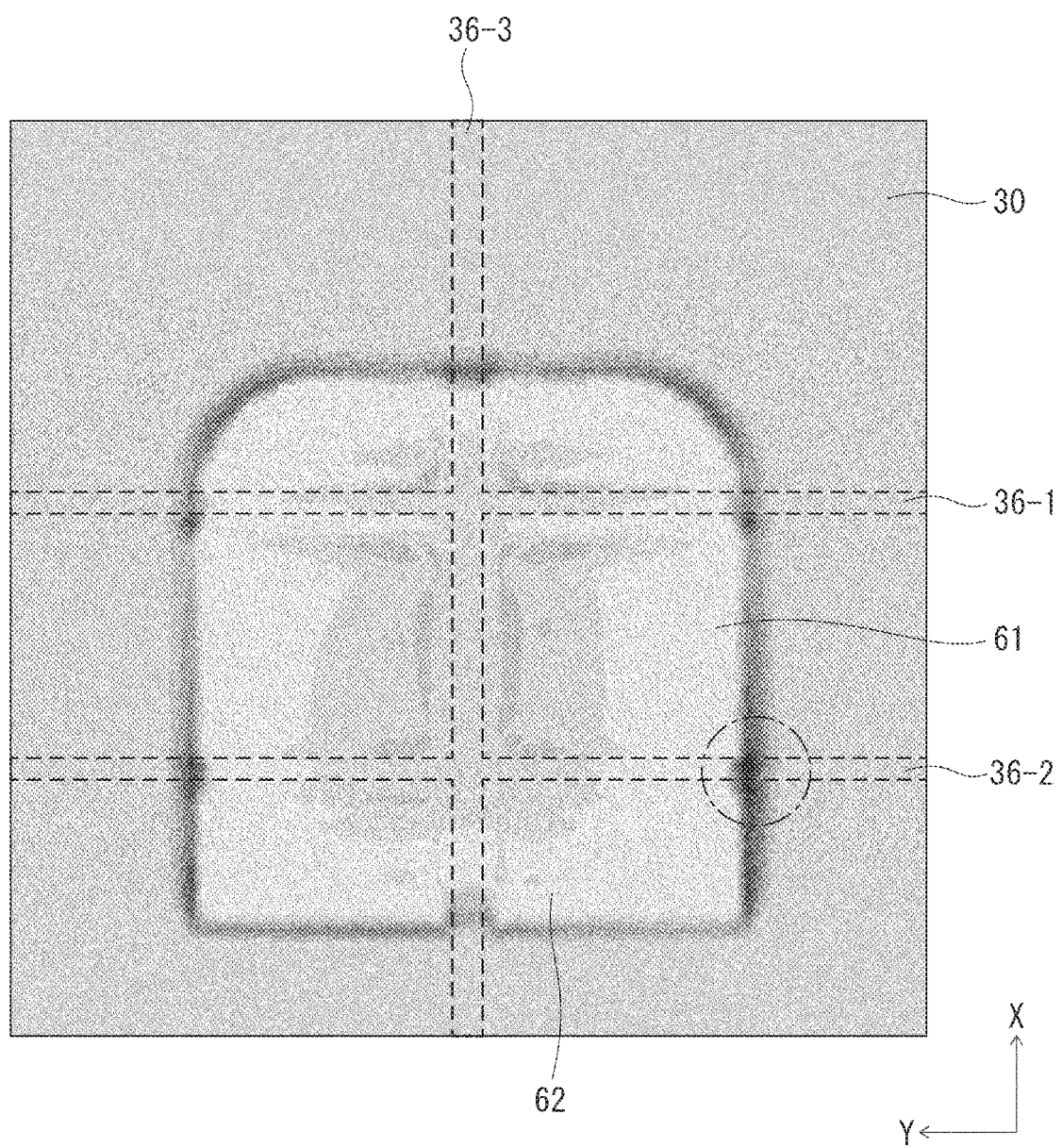
FIG. 9 is a contour view showing the plastic strain amplitude of the top surface electrode bonded to the metal wiring plate provided with grooves with a width of 0.8 millimeter.

FIG. 9 shows the simulation result of the plastic strain amplitude in the top surface electrodes 31 when the width D of the grooves 66-1 to 66-3 is set to 0.8 millimeters. The plastic strain amplitude in the top surface electrodes 31 was increased along the outline of the junction surface of the first junction part 61, as in the case shown in FIG. 8. The plastic strain amplitude was increased most in the region indicated by the dash-dotted line circle on the lower right side in the outline of the semicylindrical shape in FIG. 9, and the maximum value was about 1.74%. The plastic strain amplitude in this case, which also continuously changes between the gate runner 36-2 and the first upright part 62, had the second peak toward the first upright part 62, and the value was about 1.23%.

Figure 10:
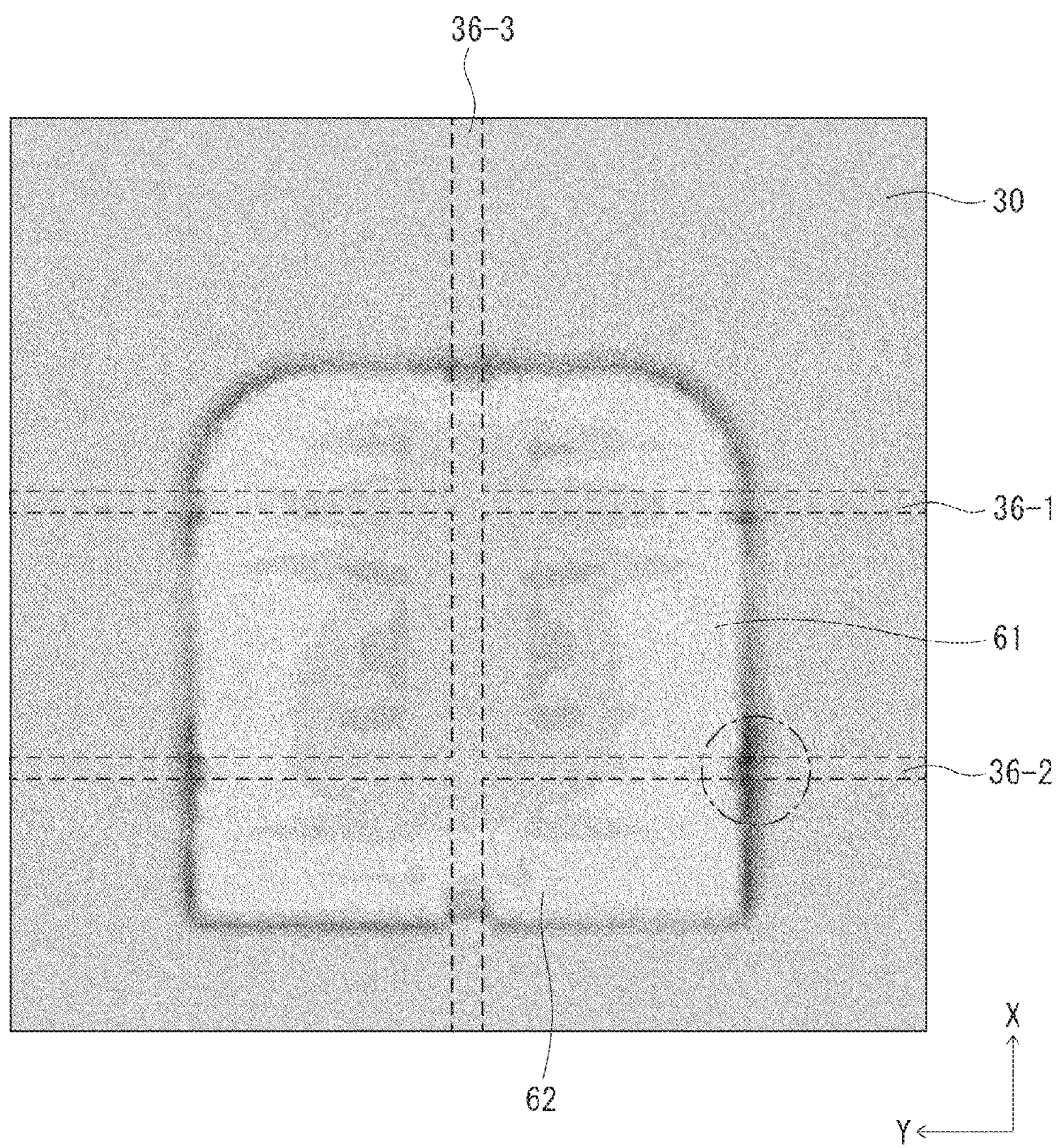
FIG. 10 is a contour view showing the plastic strain amplitude of the top surface electrode bonded to the metal wiring plate provided with grooves with a width of 1.3 millimeters.

FIG. 10 shows the simulation result of the plastic strain amplitude in the top surface electrodes 31 when the width D of the grooves 66-1 to 66-3 is set to 1.3 millimeters. The plastic strain amplitude in the top surface electrodes 31 was increased along the outline of the junction surface of the first junction part 61, as in the cases shown in FIG. 8 and FIG. 9. The plastic strain amplitude was increased most in the region indicated by the dash-dotted line circle on the lower right side in the outline of the semicylindrical shape in FIG. 10, and the maximum value was about 1.54%. The plastic strain amplitude in this case, which also continuously changes between the gate runner 36-2 and the first upright part 62, had the second peak toward the first upright part 62, and the value was about 1.16%.

Figure 11:
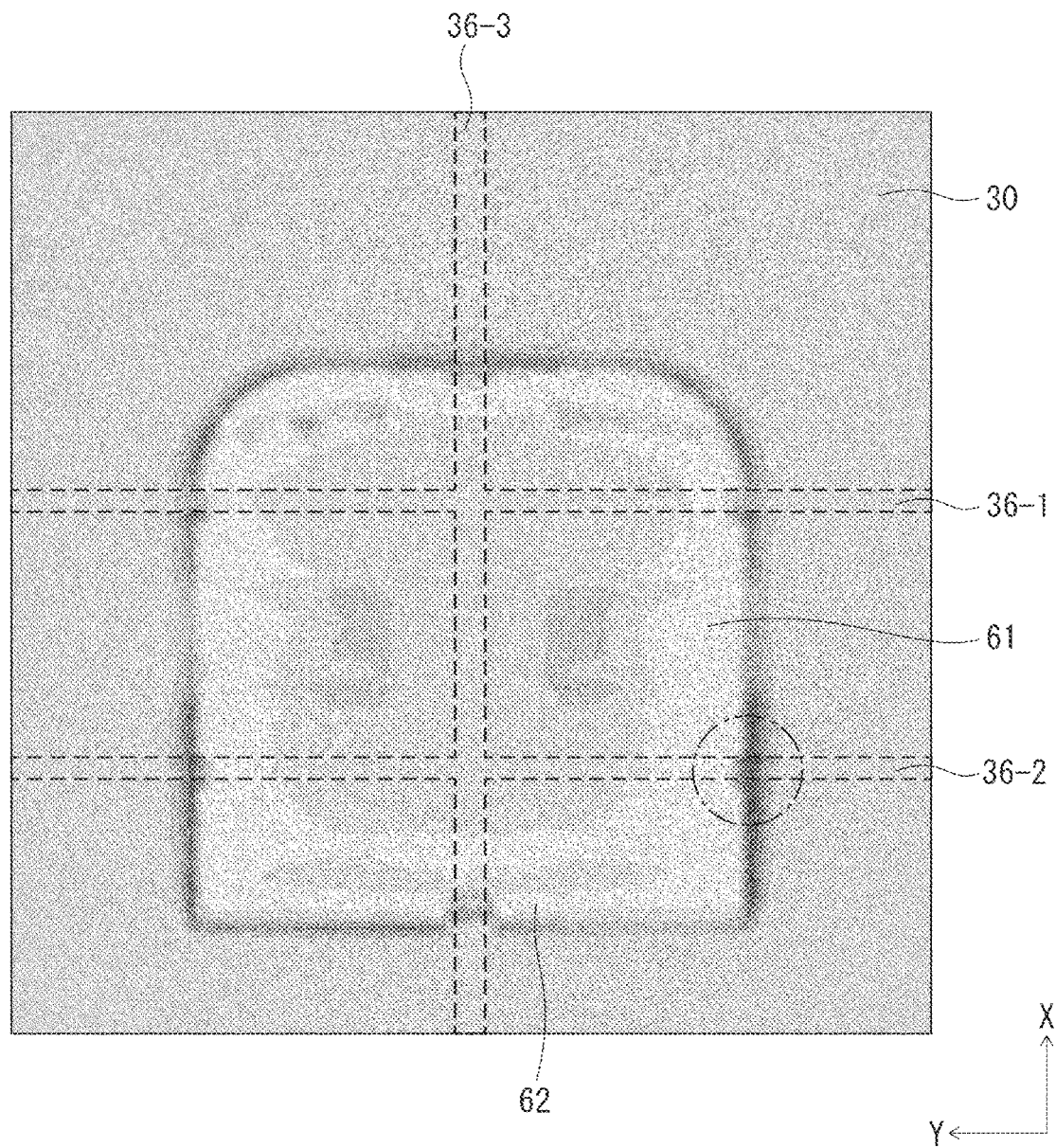
FIG. 11 is a contour view showing the plastic strain amplitude of the top surface electrode bonded to the metal wiring plate provided with grooves with a width of 2.0 millimeters.

FIG. 11 shows the simulation result of the plastic strain amplitude in the top surface electrodes 31 when the width D of the grooves 66-1 to 66-3 is set to 2.0 millimeters. The plastic strain amplitude in the top surface electrodes 31 was increased along the outline of the junction surface of the first junction part 61, as in the cases shown in FIG. 8, FIG. 9, and FIG. 10. The plastic strain amplitude was increased most in the region indicated by the dash-dotted line circle on the lower right side in the outline of the semicylindrical shape in FIG. 11, and the maximum value was about 1.29%. The plastic strain amplitude in this case, which also continuously changes between the gate runner 36-2 and the first upright part 62, had the second peak toward the first upright part 62, and the value was about 1.07%.

Figure 12:
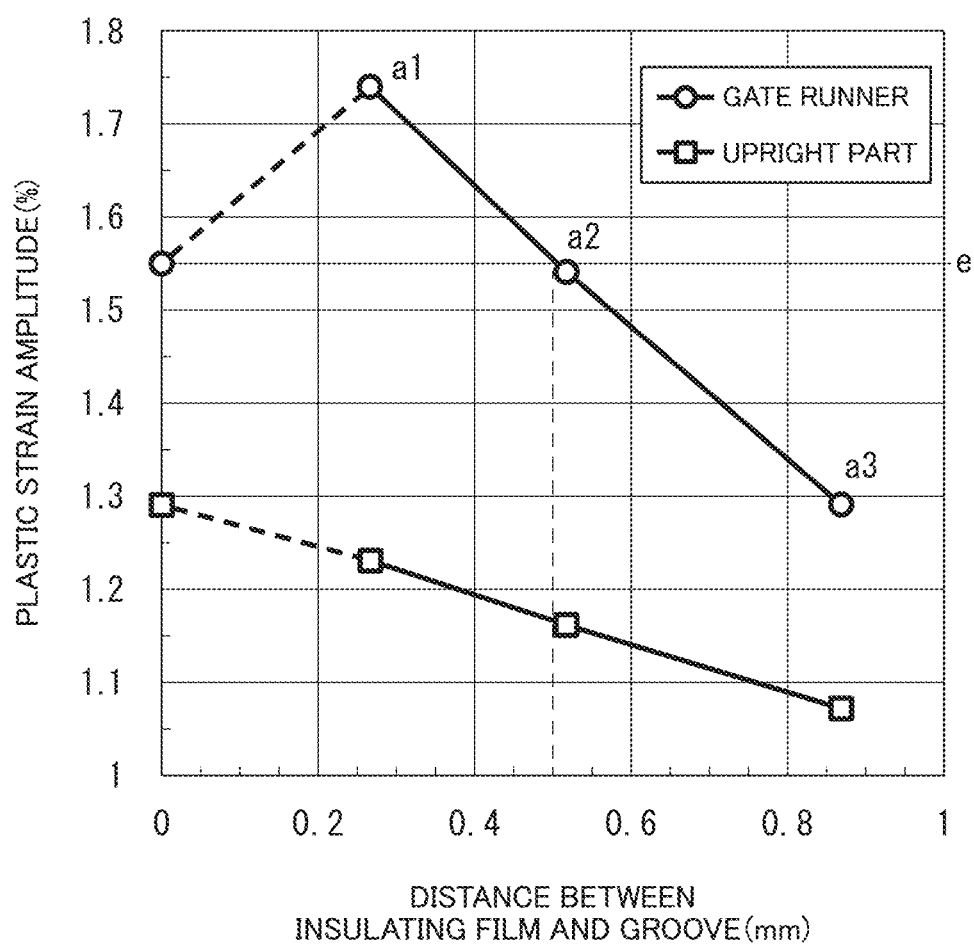
FIG. 12 is a view showing a relationship between a distance between an insulating film and a groove and a maximum value of the plastic strain amplitude of the top surface electrode.

FIG. 12 is a graph showing the plastic strain amplitude in the respective cases shown in FIG. 8 to FIG. 11. The axis of abscissas indicates a distance between the respective edges of the insulating film 34 in the width direction and the respective edges of the corresponding grooves 66-1 to 66-3 in the width direction, and the axis of ordinates indicates the plastic strain amplitude. The mark "circle" in FIG. 12 refers to the amplitude at the maximum (the first peak) in the region across the gate runner 36-2, and the mark "square" refers to the amplitude at the second peak toward the first upright part 62. The data of the distance (on the axis of abscissas) in the case shown in FIG. 8 with no grooves 66-1 to 66-3 is plotted at zero (mm). The plastic strain amplitude has the maximum value in the region across the gate runner 36-2, particularly in the region including the boundaries between the insulating film 34 and the respective plating layers 33-2 and 33-3.

It was revealed that the maximum value of the plastic strain amplitude in the top surface electrodes 31 is smaller as the width D of the groove 66-1 to 66-3 is increased and as the distance between the insulating film 34 and the respective grooves 66-1 to 66-3 is increased. It was also revealed that the plastic strain amplitude toward the first upright part 62 is smaller as the width D of the grooves 66-1 to 66-3 when provided in the first junction part 61 is increased.

In the cross-sectional view of FIG. 7, the respective edges of the insulating film 34 in the width direction, which are the edges along the extending direction of the insulating film 34, substantially correspond to the positions of the paired boundaries $A_R$ and $A_L$. The positions of the respective edges of the insulating film 34 may be hereinafter indicated also by the reference signs $A_R$ and $A_L$. The respective edges of the grooves 66-1 to 66-3 are the edges along the extending direction of the grooves 66-1 to 66-3, which correspond to the edges $B_R$ and $B_L$ in the structure of the groove 66-1 illustrated in FIG. 7. The term "distance" on the axis of abscissas in FIG. 12 refers to a distance $C_R$ in the direction parallel to the main surface of the semiconductor chip 30 between the edge on the right side of the insulating film 34 and the edge $B_R$ on the right side of the groove 66-1 defined in the structure of the groove 66-1 illustrated in FIG. 7. The term "distance" also refers to a distance $C_L$ between the edge on the left side of the insulating film 34 and the edge $B_L$ on the left side of the groove 66-1 in the direction parallel to the main surface of the semiconductor chip 30. Hereinafter, the edges of the grooves 66-1 to 66-3 are collectively referred to as the "edges B". The distance on the axis of abscissas in FIG. 12 refers to the shortest distance $C=C_R$ or $C_L$ between the edge of the insulating film 34 and the edge B of the corresponding grooves 66-1 to 66-3 in the planar pattern illustrated in FIG. 6.

The point "a1" shown in FIG. 12, which corresponds to the case shown in FIG. 9, indicates the distance $C=C_R$ or $C_L$ (0.27 millimeters; refer to FIG. 7) and the maximum value of the plastic strain amplitude of the top surface electrodes 31 when the metal wiring plate 60 includes the grooves 66-1 to 66-3 with the width of 0.8 millimeters. The point "a2" in FIG. 12, which corresponds to the case shown in FIG. 10, indicates the distance C (0.52 millimeters) and the maximum value of the plastic strain amplitude of the top surface electrodes 31 when the metal wiring plate 60 includes the grooves 66-1 to 66-3 with the width of 1.3 millimeters. The point "a3" in FIG. 12, which corresponds to the case shown in FIG. 11, indicates the distance C (0.87 millimeters) and the maximum value of the plastic strain amplitude of the top surface electrodes 31 when the metal wiring plate 60 includes the grooves 66-1 to 66-3 with the width of 2.0 millimeters. The line "e" in FIG. 12, which corresponds to the case shown in FIG. 8, indicates the maximum value of the plastic strain amplitude of the top surface electrodes 31 when the metal wiring plate 60 does not include the grooves 66-1 to 66-3.

The plastic strain amplitude $\Delta\varepsilon P$ typically follows the Manson-Coffin law according to the following formula (1):

$$\Delta\varepsilon P \times N_f^b = c \qquad (1)$$

where $N_f$ is a fatigue life, and b and c are constants derived from the material. According to the formula (1), the plastic strain amplitude needs to be reduced so as to extend the fatigue life.

As shown in FIG. 12, the maximum value of the plastic strain amplitude is presumed to increase when the distance C is about 0.5 millimeters or smaller, as compared with the case in which the metal wiring plate 60 does not include the grooves 66-1 to 66-3. This is presumed to be based on the mechanism described below. It is revealed as shown in FIG. 8 to FIG. 11 that the plastic strain amplitude is increased in the region along the outline of the junction surface of the first junction part 61. Since the edges $B_L$ and $B_R$ of the respective grooves 66-1 to 66-3 when provided can also be part of the outline of the junction surface of the first junction part 61, the plastic strain amplitude is increased immediately under the edges $B_L$ and $B_R$. The plastic strain amplitude at the boundaries $A_L$ and $A_R$ is thus increased when the distance between the boundary $A_L$ and the edge $B_L$ and the distance between the boundary $A_R$ and the edge $B_R$ are small, as compared with the case not provided with the grooves 66-1 to 66-3. This is presumed to be the mechanism in which the plastic strain amplitude is greater at the point a1 than at the point at which the distance C is zero (mm) in FIG. 12. It is also known that the plastic strain amplitude changes in inverse proportion to the thickness of the solder part 25. Providing the metal wiring plate 60 such that the distance C is set to 0.5 millimeters or greater can sufficiently ensure the thickness of the solder part 25 at the position around the paired boundaries $A_L$ and $A_R$. This also leads to a smaller influence of the edges $B_L$ and $B_R$ due to the distance C sufficiently ensured. The plastic strain amplitude in the top surface electrodes 31 thus can be reduced accordingly. The upper limit of the distance C may be set to a value sufficient to ensure an appropriate area of the respective flat land parts 67-1 and 67-2 necessary for the junction with the plating layers 33-1 to 33-6.

The characteristics indicated in FIG. 12 may vary depending on the composition of the solder part 25. As described above, however, the plastic strain amplitude of the top surface electrodes 31 changes in inverse proportion to the thickness of the solder part 25. The thickness of the solder part 25 can be the distance C between the respective edges of the insulating film 34 and the respective edges B of the corresponding grooves 66-1 to 66-3. The characteristics of the plastic strain amplitude with respect to the distance shown in FIG. 12 are presumed to be shifted substantially in the vertical direction, regardless of whether the composition of the solder part 25 is changed. Providing the grooves 66-1 to 66-3 such that the distance C between the respective edges B and the insulating film 34 is set to 0.5 millimeters or greater is thus presumed to lead the plastic strain amplitude of the top surface electrodes 31 to be reduced.

The semiconductor device according to the embodiment of the present invention defines the extending positions of the pair of the boundaries $A_R$ and $A_L$ to be encompassed within the regions of the grooves 66-1 to 66-3 in the planar pattern as viewed from the top surface of the top surface electrodes 31. As described above, the boundaries $A_R$ and $A_L$ are each a triplicate boundary at which the respective edges of the insulating film 34 and the respective edges of the corresponding plating layers 33-1 to 33-6 are present together on the top surface of the top surface electrodes 31. The thickness T1 of the solder part 25 immediately above the region interposed between the pair of the boundaries $A_R$ and $A_L$ is greater than the thickness T2 of the solder part 25 immediately above the middle portion of the respective plating layers 33-1 to 33-6, as illustrated in FIG. 7. A stress exerted on the top surface electrodes 31-1 and 31-2 caused by a force received from the metal wiring plate 60 is thus released by the solder part 25 inside the groove 66-1. This can reduce the plastic strain amplitude of the top surface electrode 31-1, so as to extend the life of the semiconductor device accordingly.

In addition, three kinds of material having different properties are also present together in line on the guard ring 35 at the boundaries between the respective edges of the insulating film and the respective edges of the corresponding plating layers 33-1 to 33-6 on the top surfaces of the top surface electrodes 31. When the first junction part 61 is located at the boundaries between the respective edges of the insulating film and the respective edges of the plating layers 33-1 to 33-6 on the guard ring 35, the bottom surface of the first junction part 61 may be provided with grooves so as to ensure a sufficient thickness of the solder part 25 along the boundaries.

(Other Embodiments)

While the present invention has been illustrated by reference to the above embodiment, it should be understood that the present invention is not intended to be limited to the descriptions and the drawings composing part of this disclosure. It will be apparent to those skilled in the art that the present invention includes various alternative embodiments, examples, and technical applications according to the above disclosure.

For example, extra grooves may further be provided in addition to the grooves 66-1 to 66-3 corresponding to the gate runners 36-1 to 36-3. The grooves 66-1 to 66-3 are only required to be provided to each correspond to at least the extending positions of the pair of the boundaries $A_R$ and $A_L$, and the dimensions and the arrangement positions may be determined as appropriate depending on the planar pattern of the pair of the boundaries $A_R$ and $A_L$.

It should be understood that the present invention includes various embodiments not disclosed herein, such as a configuration to which the respective configurations as described in the above embodiment and the respective modified examples are optionally applied. Therefore, the technical scope of the present invention is defined only by the subject matter according to the claims reasonably derived from the foregoing descriptions.

What is claimed is:

1. A semiconductor device comprising:
    a semiconductor chip including a semiconductor substrate having a top surface, a top surface electrode deposited on the top surface of the semiconductor substrate, an insulating film selectively covering edges of a top surface of the top surface electrode, and a plating layer covering the top surface of the top surface electrode exposed to an opening of the insulating film;
    a metal wiring plate including a junction part located over the insulating film and the plating layer, and provided with a groove recessed upward from a bottom surface of the junction part; and
    a solder part filling the groove so as to bond the plating layer and the bottom surface of the junction part together,
    wherein a boundary between the insulating film and the plating layer is encompassed within the groove in a plan view, and
    the solder part has a thickness greater on the boundary than on the plating layer.

2. The semiconductor device of claim 1, wherein the metal wiring plate is arranged such that a distance between an edge of the groove and the insulating film is set to 0.5 millimeters or greater.

3. The semiconductor device of claim 1, further comprising a wiring layer deposited on a top surface of the semiconductor chip separately from the top surface electrode,
    wherein the insulating film covers the wiring layer, and
    the groove is provided to encompass a position of the wiring layer in the plan view.

4. The semiconductor device of claim 3, wherein the wiring layer is used for a control electrode for controlling a main current of a semiconductor element implementing the semiconductor chip.

5. The semiconductor device of claim 1, further comprising:
    an insulating substrate on which the semiconductor chip is mounted; and
    a sealing resin provided to seal at least the semiconductor chip, the metal wiring plate, the solder part, and the insulating substrate.

* * * * *